United States Patent
Hokazono et al.

(10) Patent No.: US 9,324,714 B2
(45) Date of Patent: Apr. 26, 2016

(54) SEMICONDUCTOR DEVICE

(71) Applicant: KABUSHIKI KAISHA TOSHIBA, Minato-Ku, Tokyo (JP)

(72) Inventors: Akira Hokazono, Kawasaki (JP); Masakazu Goto, Yokohama (JP); Yoshiyuki Kondo, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 71 days.

(21) Appl. No.: 14/179,250

(22) Filed: Feb. 12, 2014

(65) Prior Publication Data
US 2015/0129960 A1    May 14, 2015

(30) Foreign Application Priority Data
Nov. 8, 2013    (JP) .................................. 2013-232490

(51) Int. Cl.
*H01L 21/70* (2006.01)
*H01L 27/092* (2006.01)
*H01L 21/8238* (2006.01)

(52) U.S. Cl.
CPC ...... *H01L 27/092* (2013.01); *H01L 21/823814* (2013.01); *H01L 21/823892* (2013.01)

(58) Field of Classification Search
None
See application file for complete search history.

(56) References Cited

U.S. PATENT DOCUMENTS

| | | | | | |
|---|---|---|---|---|---|
| 4,785,199 | A | * | 11/1988 | Kolodny | ............ H03K 19/1736 257/316 |
| 5,608,258 | A | * | 3/1997 | Rajkanan | ............ H01L 27/0629 257/296 |
| 5,936,265 | A | * | 8/1999 | Koga | ..................... G11C 11/34 257/104 |
| 6,133,082 | A | * | 10/2000 | Masuoka | ........ H01L 21/823814 257/E21.634 |
| 8,415,209 | B2 | | 4/2013 | Rooyackers et al. | |
| 8,492,793 | B2 | | 7/2013 | Ikeda et al. | |
| 2002/0045360 | A1 | * | 4/2002 | Murakami | ...... H01L 21/823412 438/786 |

(Continued)

FOREIGN PATENT DOCUMENTS

JP        2013-074288 A    4/2013

OTHER PUBLICATIONS

Taiwanese Office Action (and English translation thereof) dated Jan. 29, 2016, issued in counterpart Taiwanese Application No. 103105193.

*Primary Examiner* — Benjamin Sandvik
*Assistant Examiner* — Herve Assouman
(74) *Attorney, Agent, or Firm* — Holtz, Holtz & Volek PC

(57) ABSTRACT

In one embodiment, a semiconductor device includes a semiconductor substrate, and first and second transistors of first and second conductivity types on the substrate. The first transistor includes a first gate electrode on the substrate, a first source region of the second conductivity type and a first drain region of the first conductivity type disposed to sandwich the first gate electrode, and a first channel region of the first or second conductivity type disposed between the first source region and the first drain region. The second transistor includes a second gate electrode on the substrate, a second source region of the first conductivity type and a second drain region of the second conductivity type disposed to sandwich the second gate electrode, and a second channel region disposed between the second source region and the second drain region and having the same conductivity type as the first channel region.

18 Claims, 11 Drawing Sheets

(56) References Cited

U.S. PATENT DOCUMENTS

| | | | |
|---|---|---|---|
| 2002/0190752 A1* | 12/2002 | Takahashi | H03K 19/0016 326/81 |
| 2005/0073009 A1* | 4/2005 | Kojima | H01L 27/0266 257/362 |
| 2005/0139931 A1* | 6/2005 | Arai | H01L 27/0928 257/370 |
| 2008/0068895 A1* | 3/2008 | Kakoschke | G11C 8/08 365/185.23 |
| 2012/0228706 A1 | 9/2012 | Sugizaki et al. | |
| 2012/0241722 A1* | 9/2012 | Ikeda | H01L 27/1203 257/19 |

* cited by examiner

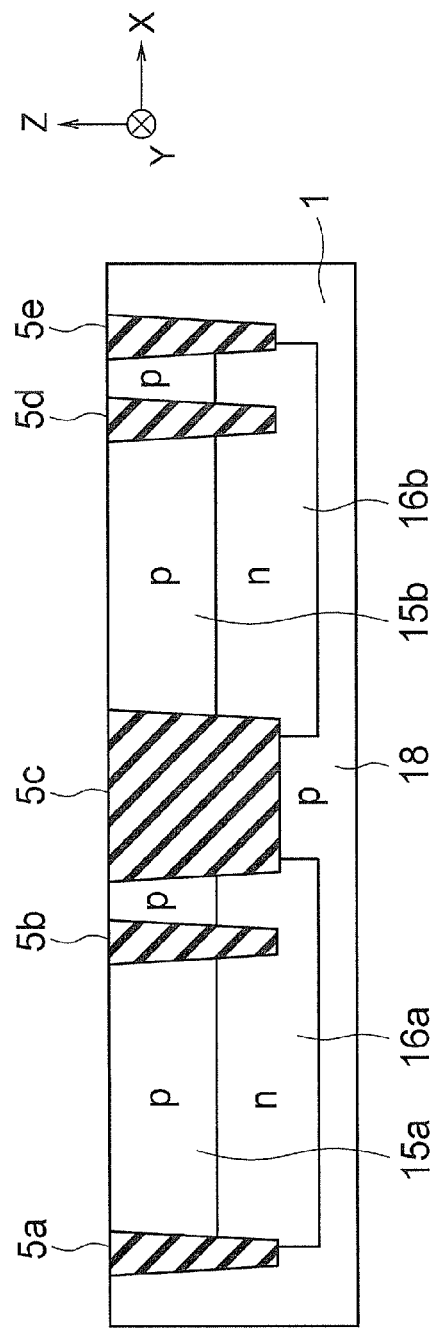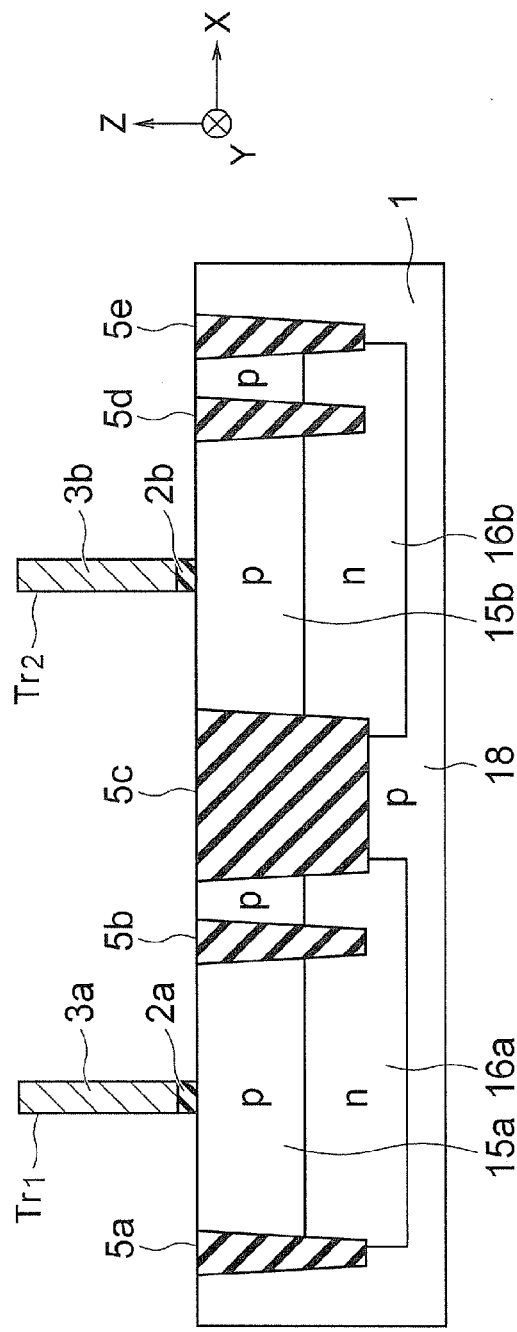

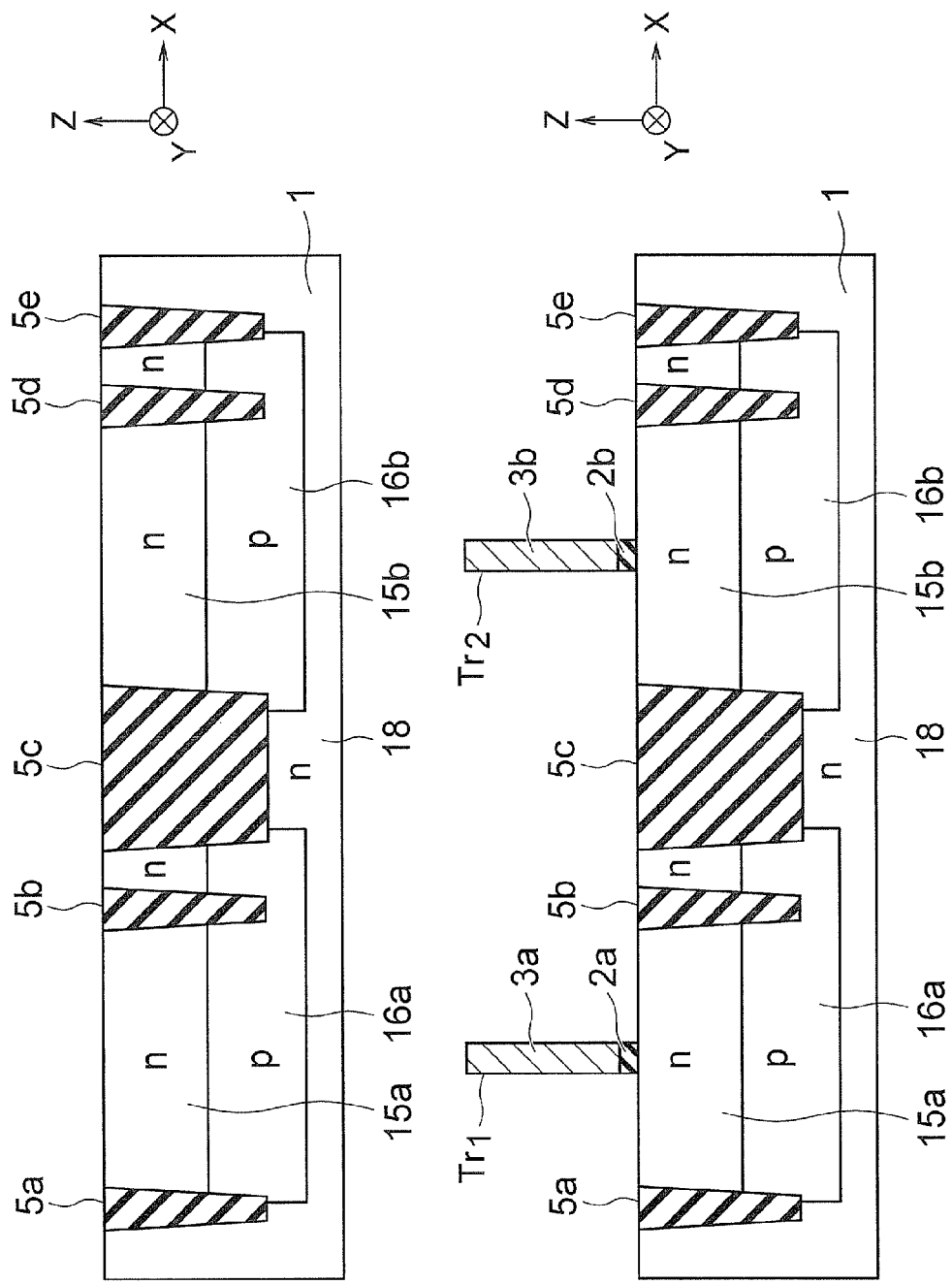

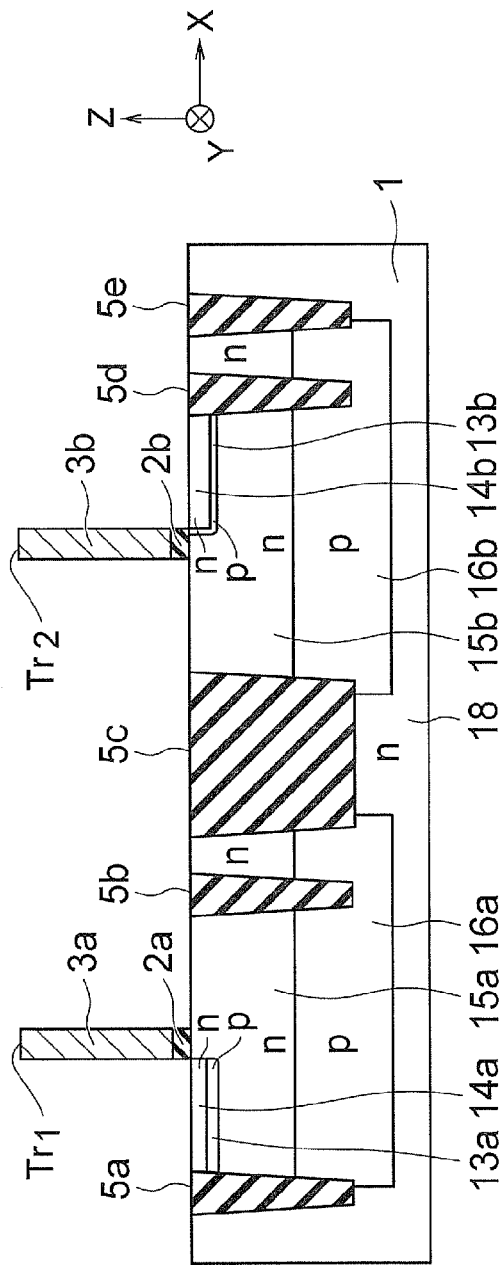
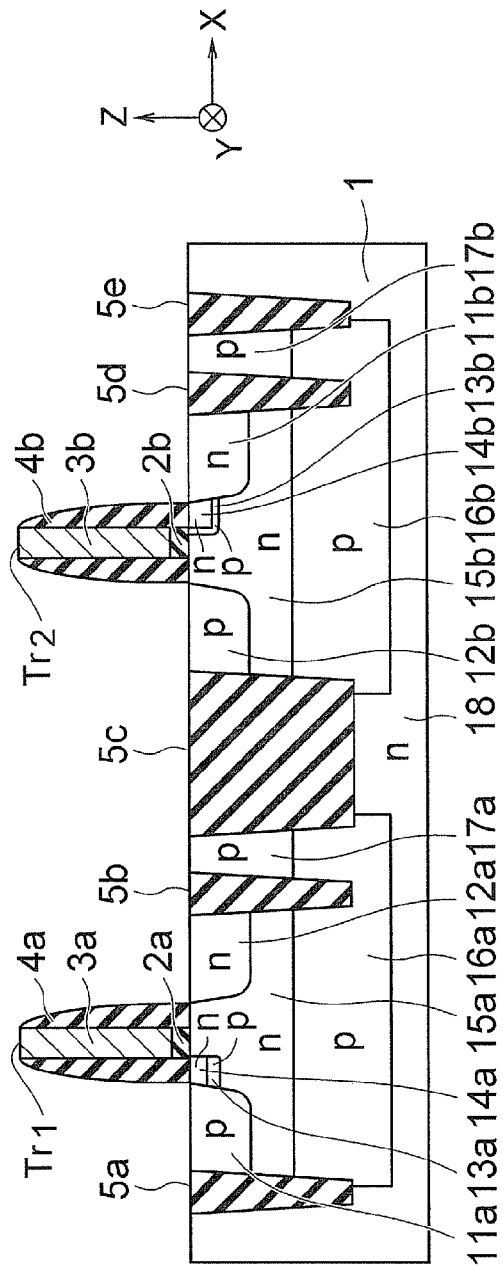

US 9,324,714 B2

SEMICONDUCTOR DEVICE

CROSS REFERENCE TO RELATED APPLICATION

This application is based upon and claims the benefit of priority from the prior Japanese Patent Application No. 2013-232490, filed on Nov. 8, 2013, the entire contents of which are incorporated herein by reference.

FIELD

Embodiments described herein relate to a semiconductor device.

BACKGROUND

The currently proposed tunnel FETs (TFETs) can be classified into three types. A first type TFET includes source and channel regions having the same conductivity type and is formed on a bulk semiconductor substrate. A second type TFET includes source and channel regions having opposite conductivity types and is formed on a bulk semiconductor substrate. A third type TFET includes source and channel regions having the same conductivity type and is formed on an SOI substrate. Although such different types of TFETs are proposed, there are few proposals on a circuit including TFETs formed on a semiconductor substrate. However, a TFET circuit has problems different from problems with a MOSFET circuit, and such problems need to be resolved. For example, when the TFETs are electrically connected by an interconnect to form an inverter circuit, source and drain regions of the TFETs on an interconnect side are electrically floating, and therefore a leakage current caused by this needs to be suppressed. Unfortunately, if the TFET circuit is formed by using a structure for resolving such problems, the resulting semiconductor device may have a complicated structure.

BRIEF DESCRIPTION OF THE DRAWINGS

FIGS. 5A to 6B are cross-sectional views showing a method of manufacturing the semiconductor device of the first embodiment;

FIGS. 8A and 9B are cross-sectional views showing a method of manufacturing the semiconductor device of the second embodiment;

DETAILED DESCRIPTION

Embodiments will now be explained with reference to the accompanying drawings.

In one embodiment, a semiconductor device includes a semiconductor substrate, a first transistor of a first conductivity type disposed on the semiconductor substrate, and a second transistor of a second conductivity type disposed on the semiconductor substrate. The first transistor includes a first gate electrode disposed on the semiconductor substrate via a first gate insulator, a first source region of the second conductivity type and a first drain region of the first conductivity type disposed to sandwich the first gate electrode, and a first channel region of the first or second conductivity type disposed between the first source region and the first drain region. The second transistor includes a second gate electrode disposed on the semiconductor substrate via a second gate insulator, a second source region of the first conductivity type and a second drain region of the second conductivity type disposed to sandwich the second gate electrode, and a second channel region disposed between the second source region and the second drain region and having the same conductivity type as the first channel region.

(First Embodiment)

Figure 1:
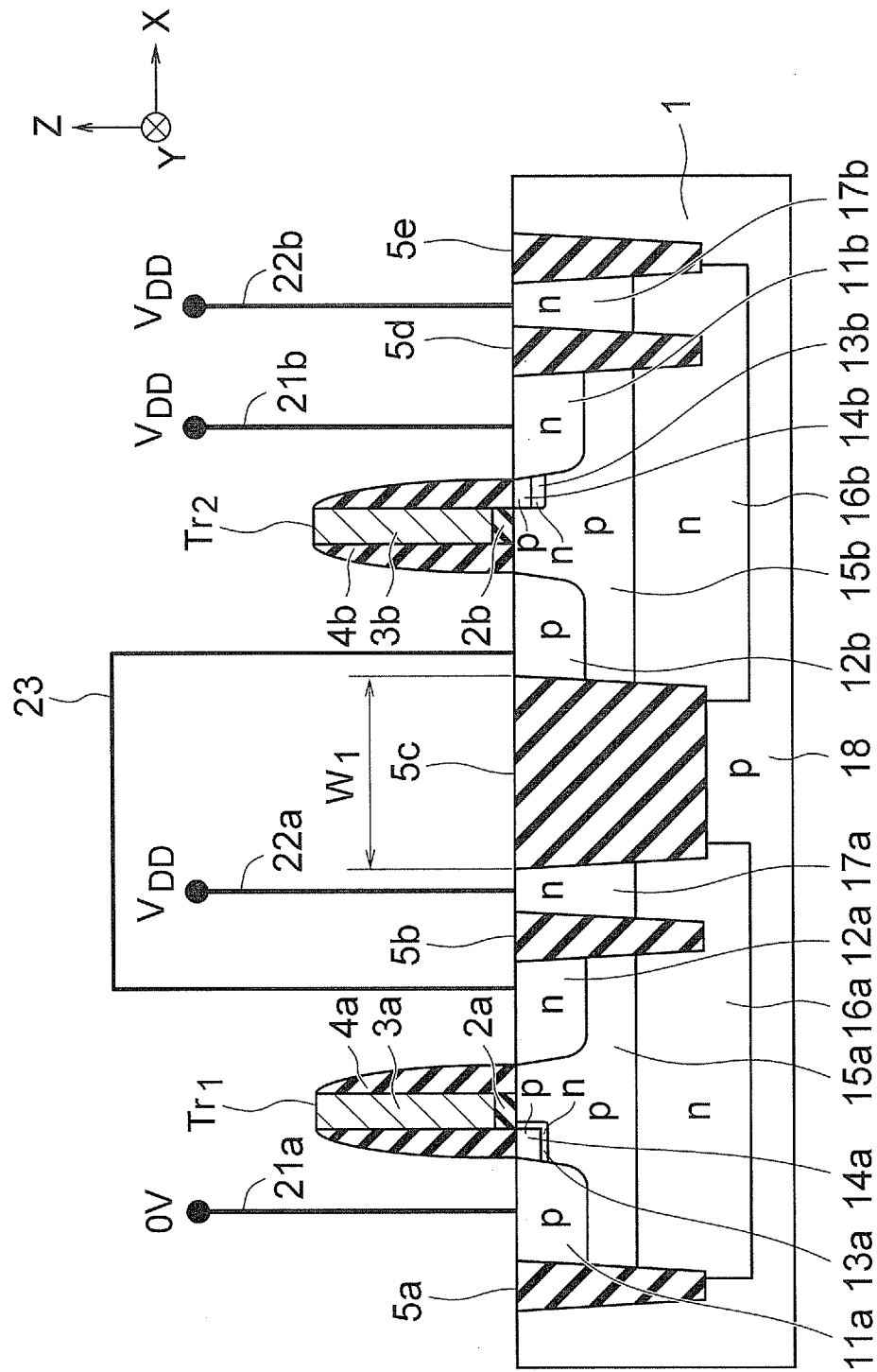
FIG. 1 is a cross-sectional view showing a structure of a semiconductor device of a first embodiment.

FIG. 1 is a cross-sectional view showing a structure of a semiconductor device of a first embodiment.

The semiconductor device of FIG. 1 includes a semiconductor substrate 1, first and second gate insulators 2a and 2b, first and second gate electrodes 3a and 3b, first and second sidewall insulators 4a and 4b, and isolation insulators 5a to 5e.

The semiconductor device of FIG. 1 further includes first and second source regions 11a and 11b, first and second drain regions 12a and 12b, first and second diffusion regions 13a and 13b, third and fourth diffusion regions 14a and 14b, first and second channel regions 15a and 15b, first and second well regions 16a and 16b, fifth and sixth diffusion regions 17a and 17b, and a semiconductor region 18.

The reference character $Tr_1$ represents a first transistor formed on the semiconductor substrate 1. The first transistor $Tr_1$ is an n-type TFET. The n-type is an example of a first conductivity type. The first transistor $Tr_1$ includes the first gate insulator 2a, the first gate electrode 3a, the first source region 11a, the first drain region 12a, the first channel region 15a, the first well region 16a and the like. The first transistor $Tr_1$ is a first type TFET in which the first source region 11a and the first channel region 15a have the same conductivity type.

The reference character $Tr_2$ represents a second transistor formed on the semiconductor substrate 1. The second transistor $Tr_2$ is a p-type TFET. The p-type is an example of a second conductivity type. The second transistor $Tr_2$ includes the second gate insulator 2b, the second gate electrode 3b, the second source region 11b, the second drain region 12b, the second channel region 15b, the second well region 16b and the like. The second transistor $Tr_2$ is a second type TFET in which the second source region 11b and the second channel region 15b have opposite conductivity types.

The reference character 21a represents an interconnect for applying a ground voltage (=0 V) to the first source region 11a. The reference character 21b represents an interconnect for applying a power supply voltage (=$V_{DD}$) to the second source region 11b. In the present embodiment, $V_{DD}$>0 V. The reference character 22a represents an interconnect for applying the power supply voltage to the fifth diffusion region 17a. The reference character 22b represents an interconnect for applying the power supply voltage to the sixth diffusion region 17b. The reference character 23 represents an interconnect electrically connecting the first and second drain regions 12a and 12b. In the present embodiment, the first and second transistors $Tr_1$ and $Tr_2$ are electrically connected by the interconnect 23 to form an inverter circuit.

Hereinafter, each component of the semiconductor device of the present embodiment will be described with reference to FIG. 1.

The semiconductor substrate 1, for example, is a p-type bulk silicon substrate. FIG. 1 shows X and Y directions which are parallel to a surface of the semiconductor substrate 1 and perpendicular to each other, and a Z direction which is perpendicular to the surface of the semiconductor substrate 1. In the description, the +Z direction is referred to as the upward direction, and the −Z direction is referred to as the downward direction. For example, the positional relationship between the semiconductor substrate 1 and the first and second gate electrodes 3a and 3b is expressed that the semiconductor substrate 1 is located below the first and second gate electrodes 3a and 3b.

The first gate electrode 3a is formed on the semiconductor substrate 1 via the first gate insulator 2a. Similarly, the second gate electrode 3b is formed on the semiconductor substrate 1 via the second gate insulator 2b. The first and second gate insulators 2a and 2b are, for example, silicon oxide films, silicon nitride films, silicon oxynitride films, higk-k films (e.g., HfSiON film) or the like. The first and second gate electrodes 3a and 3b are, for example, polysilicon layers, metal layers or the like. Each of the first and second gate electrodes 3a and 3b may be a stack film including a polysilicon layer and a metal layer.

The first sidewall insulators 4a are formed on side surfaces of the first gate electrode 3a. Similarly, the second sidewall insulators 4b are formed on side surfaces of the second gate electrode 3b. The first and second sidewall insulators 4a and 4b are, for example, TEOS films, silicon nitride films or the like. Each of the first and second sidewall insulators 4a and 4b may be a stack film including a TEOS film and a silicon nitride film.

The isolation insulators 5a to 5e are formed on the surface of the semiconductor substrate 1. The isolation insulators 5a to 5e are, for example, silicon oxide films. The first transistor $Tr_1$ is formed on the semiconductor substrate 1 between the isolation insulators 5a and 5b. The second transistor $Tr_2$ is formed on the semiconductor substrate 1 between the isolation insulators 5c and 5d. The reference character $W_1$ represents the width of the isolation insulator 5c in the X direction.

The first source region 11a and the first drain region 12a are formed in the semiconductor substrate 1 so as to sandwich the first gate electrode 3a. Similarly, the second source region 11b and the second drain region 12b are formed in the semiconductor substrate 1 so as to sandwich the second gate electrode 3b. The first source region 11a and the second drain region 12b are p-type regions. The second source region 11b and the first drain region 12a are n-type regions.

The first and third diffusion regions 13a and 14a are formed in the semiconductor substrate 1 so as to be in contact with the first source region 11a. Specifically, the first diffusion region 13a is formed on lower and lateral sides of the third diffusion region 14a. The first diffusion region 13a is an n-type region. The third diffusion region 14a is a p-type region. The third diffusion region 14a has the same conductivity type as the first source region 11a and functions as a first source extension region for the first source region 11a. On the other hand, the first diffusion region 13a has an opposite conductivity type of the first source region 11a and the third diffusion region 14a and functions as a halo region for the first source extension region.

The second and fourth diffusion regions 13b and 14b are formed in the semiconductor substrate 1 so as to be in contact with the second source region 11b. Specifically, the fourth diffusion region 14b is formed on an upper side of the second diffusion region 13b. The fourth diffusion region 14b is a p-type region. The second diffusion region 13b is an n-type region. The second diffusion region 13b has the same conductivity type as the second source region 11b and functions as a second source extension region for the second source region 11b. On the other hand, the fourth diffusion region 14b has an opposite conductivity type of the second source region 11b and the second diffusion region 13b and functions as a pocket region for the second source region 11b. In the second transistor $Tr_2$, a tunneling current flows between the second diffusion region 13b and the fourth diffusion region 14b.

The first channel region 15a is formed between the first source region 11a and the first drain region 12a. The first channel region 15a is a p-type region. Therefore, the first transistor $Tr_1$ is a first type TFET in which the first source region 11a and the first channel region 15a have the same conductivity type.

The second channel region 15b is formed between the second source region 11b and the second drain region 12b. The second channel region 15b is a p-type region. Therefore, the second transistor $Tr_2$ is a second type TFET in which the second source region 11b and the second channel region 15b have opposite conductivity types. It is noted that the second channel region 15b has the same conductivity type as the first channel region 15a.

The first well region 16a is formed under the first channel region 15a and is in contact with the first channel region 15a. The first well region 16a is an n-type region having an opposite conductivity type of the first channel region 15a.

The second well region 16b is formed under the second channel region 15b and is in contact with the second channel region 15b. The second well region 16b is an n-type region having an opposite conductivity type of the second channel region 15b. It is noted that the second well region 16b has the same conductivity type as the first well region 16a.

The fifth diffusion region 17a is formed on an upper side of the first well region 16a, and electrically connects the interconnect 22a on the semiconductor substrate 1 and the first well region 16a. The fifth diffusion region 17a is formed between the isolation insulators 5b and 5c. In the present embodiment, the fifth diffusion region 17a is provided to apply a substrate bias voltage (the power supply voltage $V_{DD}$ in this device) to the first well region 16a. The fifth diffusion region 17a is an n-type region having the same conductivity type as the first well region 16a.

The sixth diffusion region 17b is formed on an upper side of the second well region 16b, and electrically connects the interconnect 22b on the semiconductor substrate 1 and the second well region 16b. The sixth diffusion region 17b is formed between the isolation insulators 5d and 5e. In the present embodiment, the sixth diffusion region 17b is provided to apply a substrate bias voltage (the power supply voltage $V_{DD}$ in this device) to the second well region 16b. The sixth diffusion region 17b is an n-type region having the same conductivity type as the second well region 16b. It is noted that the sixth diffusion region 17b has the same conductivity type as the fifth diffusion region 17a.

In the present embodiment, the second drain region 12b and the second channel region 15b are electrically floating. Therefore, when the second transistor $Tr_2$ is turned on, the second drain region 12b and the second channel region 15b have a positive potential. In this case, if the potential of the second well region 16b is 0 V, a forward bias voltage can be applied to the pn junction between the second channel region 15b and the second well region 16b so that a leakage current can flow between these regions.

In the present embodiment, the power supply voltage $V_{DD}$ is therefore applied to the sixth diffusion region 17b to increase the potential of the second well region 16b to $V_{DD}$. This makes it possible to keep the potential of the second well region 16b higher than the potential of the second channel region 15b. Therefore, according to the present embodiment, a reverse bias voltage can be applied to the pn junction between the second channel region 15b and the second well region 16b, so that the leakage current can be prevented from flowing between these regions.

Similarly, in the present embodiment, the power supply voltage $V_{DD}$ is applied to the fifth diffusion region 17a to increase the potential of the first well region 16a to $V_{DD}$. This makes it possible to keep the potential of the first well region 16a higher than the potential of the first channel region 15a. Therefore, according to the present embodiment, a reverse bias voltage can be applied to the pn junction between the first channel region 15a and the first well region 16a, so that the leakage current can be prevented from flowing between the first channel region 15a and the first well region 16a.

The semiconductor region 18 exists under the first and second well regions 16a and 16b, and is in contact with the first and second well regions 16a and 16b. The semiconductor region 18 is a part of the semiconductor substrate 1 where no diffusion region is formed. In the present embodiment, since the semiconductor substrate 1 is a p-type substrate, the semiconductor region 18 is a p-type region.

Figure 2:
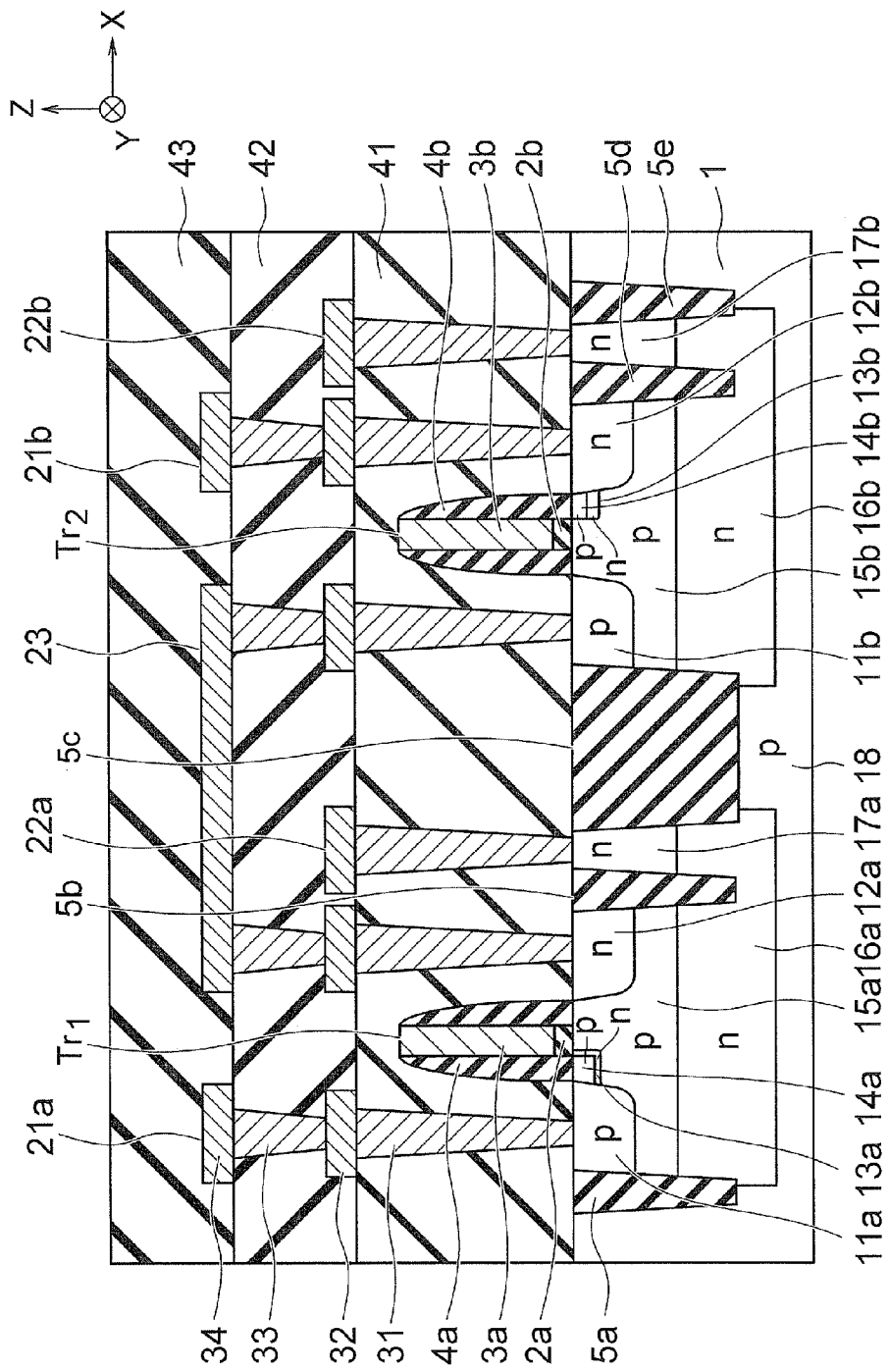
FIG. 2 is a cross-sectional view showing an example of an interconnect structure of the semiconductor device of the first embodiment.

FIG. 2 is a cross-sectional view showing an example of a interconnect structure of the semiconductor device of the first embodiment.

FIG. 2 shows, in addition to the components of FIG. 1, first and second plug layers 31 and 33, first and second interconnect layers 32 and 34, and first to third inter layer dielectrics 41 to 43.

The first to third inter layer dielectrics 41 to 43 are formed in this order on the semiconductor substrate 1. The first plug layer 31 is formed in the first inter layer dielectric 41. The first interconnect layer 32 is formed on the first inter layer dielectric 41 and covered with the second inter layer dielectric 42. The second plug layer 33 is formed in the second inter layer dielectric 42. The second interconnect layer 34 is formed on the second inter layer dielectric 42 and covered with the third inter layer dielectric 43.

In the present embodiment, the interconnects 21a, 21b, 22a, 22b and 23 can be formed, for example, by using the first and second plug layers 31 and 33 and the first and second interconnect layers 32 and 34. In the example of FIG. 2, the interconnect 23 connecting the first and second drain regions 12a and 12b is formed by using contact plugs in the first plug layer 31, via plugs in the second plug layer 33, and interconnects in the first and second interconnect layers 32 and 34. The semiconductor device of the present embodiment may have an alternative interconnect structure different from that of the example of FIG. 2.

(1) Details of Semiconductor Device of First Embodiment

Details of the semiconductor device of the first embodiment will be described with reference to FIG. 1 again.

In the present embodiment, the first transistor $Tr_1$ is an n-type TFET of the first type, and the second transistor $Tr_2$ is a p-type TFET of the second type.

Therefore, the first and second transistors $Tr_1$ and $Tr_2$ in the present embodiment have structures similar to each other. Specifically, the first and second channel regions 15a and 15b have the same conductivity type. The first and second well regions 16a and 16b have the same conductivity type. The fifth and sixth diffusion regions 17a and 17b have the same conductivity type. Accordingly, the semiconductor device of the present embodiment has a simple structure in which transistors with similar structures are aligned. In the present embodiment, the substrate bias voltage applied to the first well region 16a is set equal to the substrate bias voltage applied to the second well region 16b.

Therefore, according to the present embodiment, the semiconductor device can be simply designed and fabricated. For example, the first and second channel regions 15a and 15b can be formed in the same process, which makes it possible to reduce the number of processes for manufacturing the semiconductor device. The same also applies to the first and second well regions 16a and 16b and the fifth and sixth diffusion regions 17a and 17b.

According to the present embodiment, the structure of the semiconductor device can be made simpler using the structure of first and second modifications described below.

Figure 3:
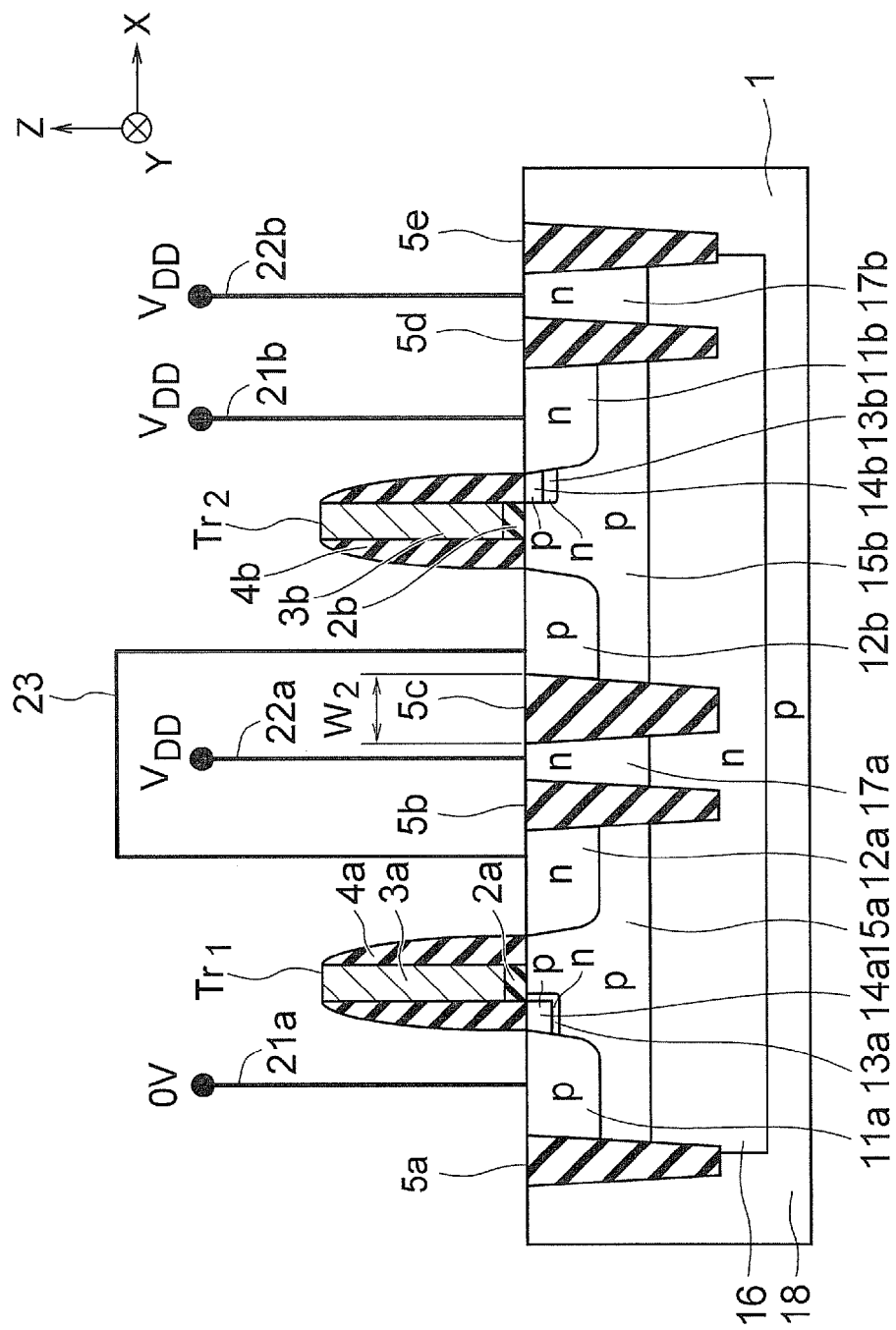
FIG. 3 is a cross-sectional view showing a structure of a semiconductor device of a first modification of the first embodiment.

FIG. 3 is a cross-sectional view showing a structure of a semiconductor device of a first modification of the first embodiment.

In FIG. 1, the first and second well regions 16a and 16b have the same conductivity type, and the same substrate bias voltage is applied to the first and second well regions 16a and 16b. Therefore, the first and second well regions 16a and 16b do not always need to be separated from each other.

In FIG. 3, a well region 16 is therefore substituted for the first and second well regions 16a and 16b. The well region 16 is formed under the first and second channel regions 15a and 15b and is in contact with the first and second channel regions 15a and 15b. The well region 16 is an n-type region and has an opposite conductivity type of the first and second channel regions 15a and 15b.

In FIG. 1, since the first and second well regions 16a and 16b do not always need to be separated from each other, the width of the isolation insulator 5c between the first and second well regions 16a and 16b may be narrowed.

In FIG. 3, the width of the isolation insulator 5c is therefore reduced to $W_2$ from $W_1$. The width of the isolation insulator 5c, for example, may be set substantially equal to that of other isolation insulators 5a, 5b, 5d and 5e. According to the present modification, the reduction of the width of the isolation insulator 5c makes it possible to increase the degree of integration of the semiconductor device.

Figure 4:
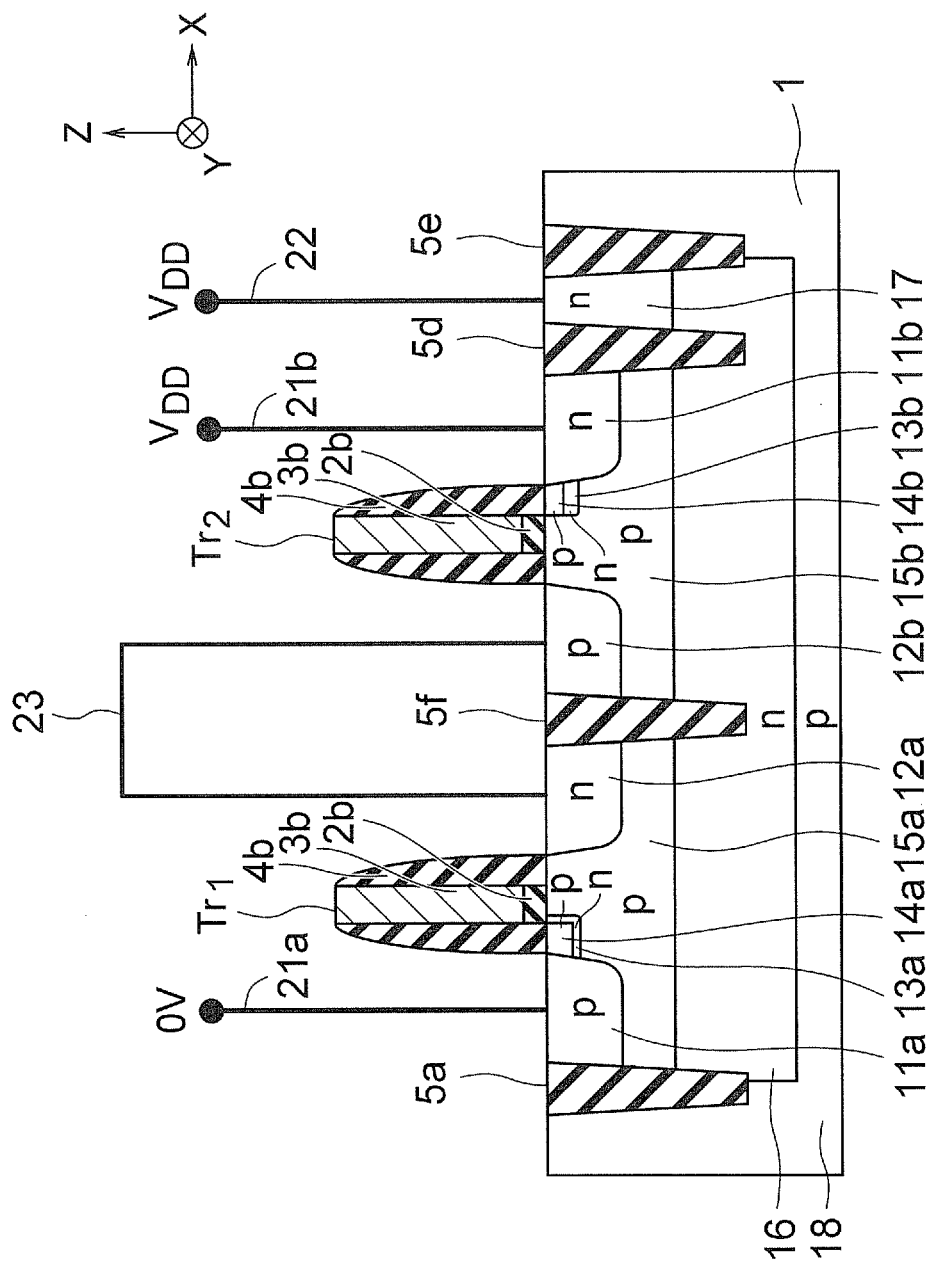
FIG. 4 is a cross-sectional view showing a structure of a semiconductor device of a second modification of the first embodiment.

FIG. 4 is a cross-sectional view showing a structure of a semiconductor device of a second modification of the first embodiment.

When the first and second well regions 16a and 16b of FIG. 1 are replaced by the well region 16, any one of the fifth and sixth diffusion regions 17a and 17b may be deleted.

In FIG. 4, a diffusion region 17 is therefore substituted for the fifth and sixth diffusion regions 17a and 17b. The diffusion region 17 is formed on an upper side of the well region 16 and electrically connects the interconnect 22 on the semiconductor substrate 1 and the well region 16. The diffusion region 17 is formed between the isolation insulators 5d and 5e. In the present modification, the diffusion region 17 is provided to apply a substrate bias voltage (the power supply voltage $V_{DD}$ in this device) to the well region 16. The diffusion region 17 is an n-type region having the same conductivity type as the well region 16. According to the present modification, the area of the diffusion region for the substrate bias can be reduced, which makes it possible to increase the degree of integration of the semiconductor device.

When the fifth and sixth diffusion regions 17a and 17b of FIG. 1 are replaced by the diffusion region 17, any one of the isolation insulators 5b and 5c may also be deleted.

In FIG. 4, an isolation insulator 5f is therefore substituted for the isolation insulators 5b and 5c. The isolation insulator 5f is formed between the first and second drain regions 12a and 12b and is in contact with both the first and second drain regions 12a and 12b. Specifically, the first and second drain regions 12a and 12b of FIG. 4 are in contact with the same isolation insulator 5f. According to the present modification, the area required for the isolation can be reduced, which makes it possible to increase the degree of integration of the semiconductor device.

Hereinafter, details of the semiconductor device of the first embodiment will be described with reference to FIG. 1 again.

The semiconductor substrate 1 in the present embodiment may be a p-type substrate or an n-type substrate. However, if the semiconductor substrate 1 is an n-type substrate, the semiconductor region 18 is an n-type region as well as the first and second wells 16a and 16b. Therefore, in a chase where another circuit block is formed on the semiconductor substrate 1 in addition to a circuit block formed by the first and second transistors $Tr_1$ and $Tr_2$ and the like, and where the effect of noise between these circuit blocks needs to be eliminated or these blocks are controlled by different substrate bias controls, a p-type deep well region is formed under the first and second wells 16a and 16b. To form the deep well region, however, it is generally necessary to perform a highly-accelerated ion implantation. Therefore, the formation of the deep well region may increase the number of processes and the process cost. On the other hand, if the semiconductor substrate 1 is a p-type substrate, such a deep well region will be generally unnecessary. Therefore, if the semiconductor substrate 1 is a p-type substrate, the process of forming the deep well region can be omitted.

In the present embodiment, the positions of the first source region 11a and the first drain region 12a may be interchanged, and the positions of the second source region 11b and the second drain region 12b may be interchanged. In this case, the first and second drain regions 12a and 12b may be electrically connected by the interconnect 23 to form the inverter circuit.

In the present embodiment, as similar to connecting two TFETs of different conductivity types to form the inverter circuit, two or more TFETs of the same conductivity type may be cascode-connected to form a vertically-stacked circuit. In this case, the individual well regions of these TFETs may be replaced by a single well region as similar to the well region 16. In addition, the individual diffusion regions for substrate bias may be replaced by a single diffusion region as similar to the diffusion region 17.

(2) Method of Manufacturing Semiconductor Device of First Embodiment

FIGS. 5A to 6B are cross-sectional views showing a method of manufacturing the semiconductor device of the first embodiment.

First, as shown in FIG. 5A, the isolation insulators 5a to 5e are formed on the surface of the semiconductor substrate 1. For example, each of the isolation insulators 5a to 5e has a thickness of 200 to 300 nm in the Z direction. The isolation insulators 5a to 5e can be formed, for example, by forming isolation trenches on the surface of the semiconductor device 1 by lithography and etching, embedding a silicon oxide film in the isolation trenchs, and planarizing the surface of the silicon oxide film by chemical mechanical polishing (CMP).

A silicon oxide film (not shown) is then formed on a surface of a device region of the semiconductor substrate 1. For example, this silicon oxide film has a thickness of 10 nm or less.

A first ion implantation is then performed to form the first and second well regions 16a and 16b (FIG. 5A). For example, n-type impurities such as phosphorus (P) are used in the first ion implantation. In the first ion implantation of the present embodiment, the ion implantation energy is set at 500 keV, and the n-type impurity dose is set at $3.0 \times 10^{13}$ $cm^{-2}$.

A second ion implantation is then performed to form the first and second channel regions 15a and 15b (FIG. 5A). For example, p-type impurities such as boron (B) are used in the second ion implantation. In the second ion implantation of the present embodiment, the ion implantation energy is set at 10 keV, and the p-type impurity dose is set at $1.5 \times 10^{13}$ $cm^{-2}$. In the present embodiment, the threshold voltage of the first and second transistors $Tr_1$ and $Tr_2$ can be controlled by the second ion implantation.

Rapid thermal anneal (RTA) is then performed to activate the n- and p-type impurities implanted by the first and second ion implantations. Consequently, as shown in FIG. 5A, the first and second well regions 16a and 16b and the first and second channel regions 15a and 15b are formed in the semiconductor substrate 1. The first and second ion implantations may be performed in an order different from that in the present embodiment.

As shown in FIG. 5B, the first and second gate electrodes 3a and 3b are then formed on the first and second channel regions 15a and 15b via the first and second gate insulators 2a and 2b, respectively.

For example, the first and second gate insulators 2a and 2b and the first and second gate electrodes 3a and 3b can be formed by the following procedure. First, thermal oxidation or low pressure chemical vapor deposition (LPCVD) is performed to form a silicon oxide film for forming the first and second gate insulators 2a and 2b. For example, the silicon oxide film has a thickness of 0.5 to 6 nm. Next, a polysilicon layer for forming the first and second gate electrodes 3a and 3b is formed on the silicon oxide film. For example, the polysilicon layer has a thickness of 50 to 200 nm. The silicon oxide film and the polysilicon layer are then subjected to lithography and etching to form the first and second gate insulators 2a and 2b and the first and second gate electrodes 3a and 3b, respectively. Examples of the lithography include photolithography, X-ray lithography, electron beam lithography and the like. Examples of the etching include reactive ion etching (RIE) and the like.

In the present embodiment, pre-doping may be performed to implant n- and p-type impurities into the first and second gate electrodes 3a and 3b, respectively. For example, the n- and p-type impurities used in the pre-doping are phosphorus (P) and boron (B). In the pre-doping with the n-type impurities, the ion implantation energy is set at 5 keV, and the n-type impurity dose is set at $5.0 \times 10^{15}$ $cm^{-2}$, for example. In the pre-doping with the p-type impurities, the ion implantation energy is set at 2.5 keV, and the p-type impurity dose is set at $5.0 \times 10^{15}$ $cm^{-2}$, for example.

Thermal oxidation is then performed to form a post-oxidation film (not shown) on the side surfaces of the first and second gate electrodes 3a and 3b. For example, the post-oxidation film is a silicon oxide film.

An offset spacer film (not shown) is formed on the side surfaces of the first and second gate electrodes 3a and 3b via the post-oxidation film. For example, the offset spacer film is a silicon nitride film. The offset spacer film can be formed, for example, by forming a silicon nitride film with a thickness of 3 to 12 nm over the surface of semiconductor substrate 1 by LPCVD, and patterning the silicon nitride film by RIE.

Figures 6A, 6B:
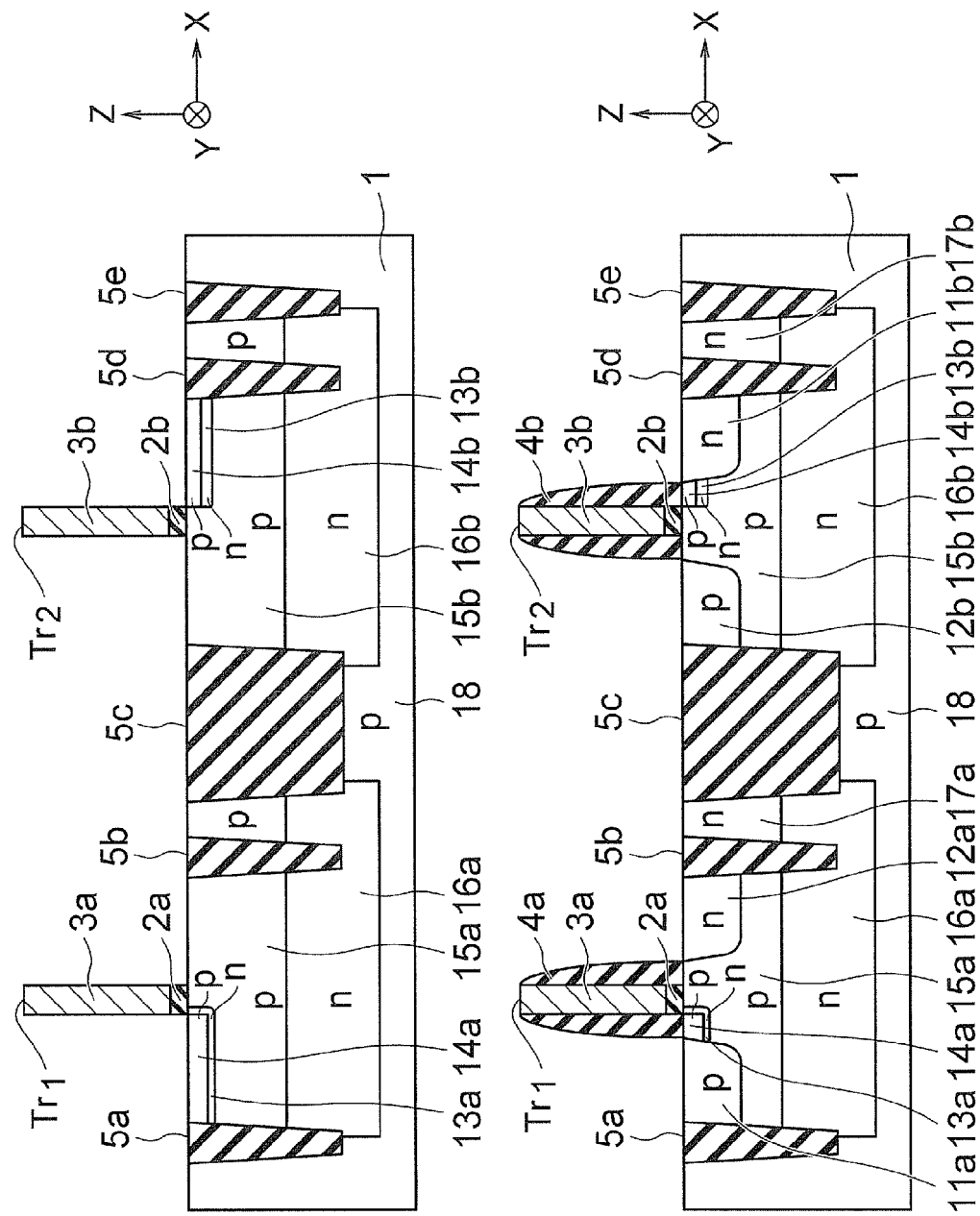

A resist film (not shown) having an opening at a region where the first source region 11a is to be formed is then formed on the semiconductor substrate 1. Next, a third ion implantation is performed to form the first diffusion region 13a, and a fourth ion implantation is performed to form the third diffusion region 14a (FIG. 6A). In the present embodiment, the third ion implantation is an angled ion implantation. The resist film is removed after the third and fourth ion implantations.

For example, n-type impurities such as arsenic (As) are used in the third ion implantation. In the third ion implantation of the present embodiment, the ion implantation energy is set at 40 keV, and the n-type impurity dose is set at $3.0 \times 10^{13}$ cm$^{-2}$.

For example, the fourth ion implantation is performed using boron difluoride (BF$_2$). In the fourth ion implantation of the present embodiment, the ion implantation energy is set at 2 keV, and the p-type impurity dose is set at $1.0 \times 10^{15}$ cm$^{-2}$.

A resist film (not shown) having an opening at a region where the second source region 11b is to be formed is then formed on the semiconductor substrate 1. Next, a fifth ion implantation is performed to form the second diffusion region 13b, and a sixth ion implantation is performed to form the fourth diffusion region 14b (FIG. 6A). The resist film is removed after the fifth and sixth ion implantations.

For example, n-type impurities such as arsenic (As) are used in the fifth ion implantation. In the fifth ion implantation of the present embodiment, the ion implantation energy is set at 10 keV, and the n-type impurity dose is set at $3.0 \times 10^{13}$ cm$^{-2}$.

For example, the sixth ion implantation is performed using boron difluoride (BF$_2$). In the sixth ion implantation of the present embodiment, the ion implantation energy is set at 2 keV, and the p-type impurity dose is set at $3.0 \times 10^{13}$ cm$^{-2}$.

RTA is then performed to activate the n- and p-type impurities implanted by the third to sixth ion implantations. Consequently, as shown in FIG. 6A, the first and third diffusion regions 13a and 14a are formed in the vicinity of the first gate electrode 3a, and the second and fourth diffusion regions 13b and 14b are formed in the vicinity of the second gate electrode 3b. The third to sixth ion implantations may be performed in an order different from that in the present embodiment.

As shown in FIG. 6B, the first and second sidewall insulators 4a and 4b are then formed on the side surfaces of first and second gate electrodes 3a and 3b, respectively. For example, the first and second sidewall insulators 4a and 4b can be formed by forming a TEOS film over the surface of the semiconductor substrate 1, and patterning the TEOS film by an etchback process.

A seventh ion implantation is then performed to form the second source region 11b, the first drain region 12a, the fifth diffusion region 17a, and the sixth diffusion region 17b (FIG. 6B). For example, n-type impurities such as arsenic (As) and phosphorus (P) are used in the seventh ion implantation. In the seventh ion implantation of the present embodiment, the ion implantation energy is set at 20 keV for arsenic and at 5 keV for phosphorus, and the dose is set at $2.0 \times 10^{15}$ cm$^{-2}$ for arsenic and at $2.0 \times 10^{15}$ cm$^{-2}$ for phosphorus.

An eighth ion implantation is then performed to form the first source region 11a and the second drain region 12b (FIG. 6B). For example, p-type impurities such as boron (B) are used in the eighth ion implantation. In the eighth ion implantation of the present embodiment, the boron ion implantation energy is set at 2 keV, and the boron dose is set at $4.0 \times 10^{15}$ cm$^{-2}$.

RTA is then performed to activate the n- and p-type impurities implanted by the seventh and eighth ion implantations. Consequently, as shown in FIG. 6B, the first source region 11a and the first drain region 12a are formed in the vicinity of the first gate electrode 3a, and the second source region 11b and the second drain region 12b are formed in the vicinity of the second gate electrode 3b. In addition, the fifth and sixth diffusion regions 17a and 17b are formed in the semiconductor substrate 1. The seventh and eighth ion implantations may be performed in an order different from that in the present embodiment.

Subsequently, silicide layers, inter layer dielectrics, plug layers, interconnect layers, a passivation layer and the like are formed on the semiconductor substrate 1. For example, the first and second plug layers 31 and 33, the first and second interconnect layers 32 and 34, the first to third inter layer dielectrics 41 to 43 and the like of FIG. 2 are formed. In this way, the semiconductor device of the present embodiment is manufactured.

When the semiconductor device of FIG. 3 is manufactured, the well region 16 is formed instead of the first and second well regions 16a and 16b in the step of FIG. 5A.

When the semiconductor device of FIG. 4 is manufactured, the isolation insulator 5f is formed instead of the isolation insulators 5b and 5c in the step of FIG. 5A, and the well region 16 is formed instead of the first and second well regions 16a and 16b in the step of FIG. 5A. In this case, the diffusion region 17 is also formed instead of the fifth and sixth diffusion regions 17a and 17b in the step of FIG. 6B.

As described above, an n-type TFET of the first type is formed as the first transistor Tr$_1$, and a p-type TFET of the second type is formed as the second transistor Tr$_2$ in the present embodiment. Therefore, the present embodiment can provide a semiconductor device of a simple structure when a plurality of tunnel transistors (Tr$_1$ and Tr$_2$) are formed on the semiconductor substrate 1 to form a circuit.

(Second Embodiment)

Figure 7:
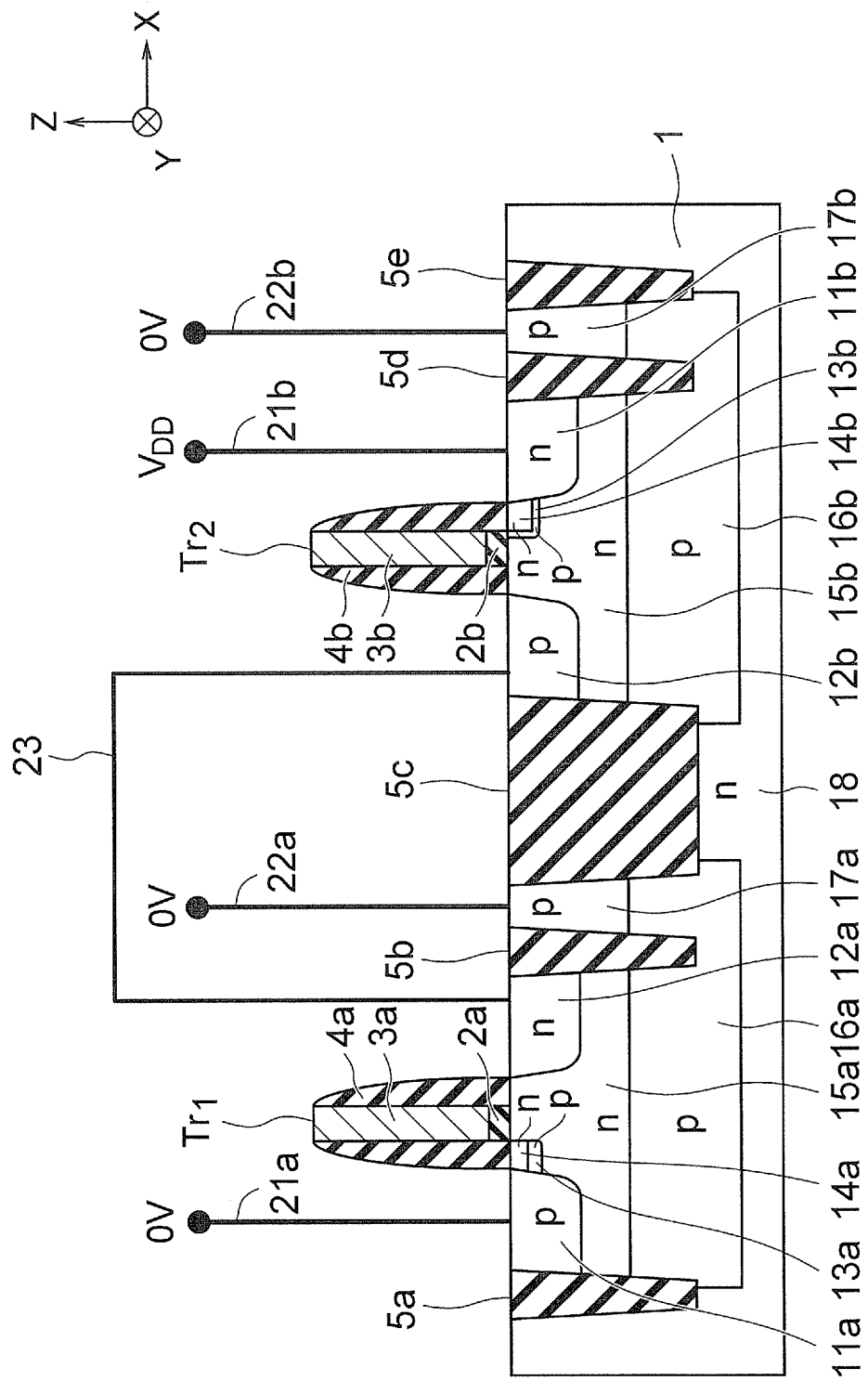
FIG. 7 is a cross-sectional view showing a structure of a semiconductor device of a second embodiment.

FIG. 7 is a cross-sectional view showing a structure of a semiconductor device of a second embodiment.

The first transistor Tr$_1$ in the present embodiment is an n-type TFET of the second type in which the first source region 11a and the first channel region 15a have opposite conductivity types. In the present embodiment, the first source region 11a, the first diffusion region 13a, the first well region 16a, and the fifth diffusion region 17a are p-type regions, and the first drain region 12a, the third diffusion region 14a, and the first channel region 15a are n-type regions. The first and third diffusion regions 13a and 14a function as a first source extension region for the first source region 11a and as a pocket region for the first source region 11a, respectively. The third diffusion region 14a is formed on an upper side of the first diffusion region 13a.

On the other hand, the second transistor Tr$_2$ in the present embodiment is a p-type TFET of the first type in which the second source region 11b and the second channel region 15b have the same conductivity type. In the present embodiment, the second source region 11b, the fourth diffusion region 14b, and the second channel region 15b are n-type regions, and the second drain region 12b, the second diffusion region 13b, the second well region 16b, and the sixth diffusion region 17b are p-type regions. The fourth and second diffusion regions 14b and 13b function as a second source extension region for the second source region 11b and as a halo region for the second source extension region, respectively. The second diffusion region 13b is formed on lower and lateral sides of the fourth diffusion region 14b.

The semiconductor substrate 1 in the present embodiment is an n-type substrate. Therefore, the semiconductor region 18 in the present embodiment is an n-type region.

The interconnect 23 in the present embodiment electrically connects the first and second drain regions 12a and 12b. The first and second transistors $Tr_1$ and $Tr_2$ in the present embodiment are electrically connected by the interconnect 23 to form an inverter circuit.

The interconnects 22a and 22b in the present embodiment are used to apply the ground voltage (=0 V) to the fifth and sixth diffusion regions 17a and 17b, respectively. According to the present embodiment, a reverse bias voltage can be applied to the pn junction between the first channel region 15a and the first well region 16a by applying the ground voltage to the fifth diffusion region 17a. According to the present embodiment, a reverse bias voltage can also be applied to the pn junction between the second channel region 15b and the second well region 16b by applying the ground voltage to the sixth diffusion region 17b.

The structures of the first and second modifications of the first embodiment (see FIGS. 3 and 4) are also applicable to the second embodiment.

(1) Method of Manufacturing Semiconductor Device of Second Embodiment

FIGS. 8A to 9B are cross-sectional views showing a method of manufacturing the semiconductor device of the second embodiment. In the description below, details of common features between the first and second embodiments will be omitted.

First, as shown in FIG. 8A, the isolation insulators 5a to 5e are formed on the surface of the semiconductor substrate 1.

The first ion implantation is then performed to form the first and second well regions 16a and 16b (FIG. 8A). For example, p-type impurities such as boron (B) are used in the first ion implantation. In the first ion implantation of the present embodiment, the ion implantation energy is set at 260 keV, and the p-type impurity dose is set at $2.0 \times 10^{13}$ cm$^{-2}$.

The second ion implantation is then performed to form the first and second channel regions 15a and 15b (FIG. 8A). For example, n-type impurities such as arsenic (As) are used in the second ion implantation. In the second ion implantation of the present embodiment, the ion implantation energy is set at 80 keV, and the n-type impurity dose is set at $1.0 \times 10^{13}$ cm$^{-2}$.

RTA is then performed to activate the n- and p-type impurities implanted by the first and second ion implantations.

As shown in FIG. 8B, the first and second gate electrodes 3a and 3b are then formed on the first and second channel regions 15a and 15b via the first and second gate insulators 2a and 2b, respectively.

Next, the third ion implantation is performed to form the first diffusion region 13a, and the fourth ion implantation is performed to form the third diffusion region 14a (FIG. 9A).

For example, the third ion implantation is performed using boron difluoride (BF$_2$). In the third ion implantation of the present embodiment, the ion implantation energy is set at 15 keV, and the p-type impurity dose is set at $3.0 \times 10^{14}$ cm$^{-2}$.

For example, n-type impurities such as arsenic (As) are used in the fourth ion implantation. In the fourth ion implantation of the present embodiment, the ion implantation energy is set at 2 keV, and the n-type impurity dose is set at $2.4 \times 10^{14}$ cm$^{-2}$.

Next, the fifth ion implantation is performed to form the second diffusion region 13b, and the sixth ion implantation is performed to form the fourth diffusion region 14b (FIG. 9A). In the present embodiment, the fifth ion implantation is an angled ion implantation.

For example, the fifth ion implantation is performed using boron difluoride (BF$_2$). In the fifth ion implantation of the present embodiment, the ion implantation energy is set at 20 keV, and the p-type impurity dose is set at $3.0 \times 10^{13}$ cm$^{-2}$.

For example, n-type impurities such as arsenic (As) are used in the sixth ion implantation. In the sixth ion implantation of the present embodiment, the ion implantation energy is set at 1 keV, and the n-type impurity dose is set at $1.0 \times 10^{15}$ cm$^{-2}$.

RTA is then performed to activate the n- and p-type impurities implanted by the third to sixth ion implantations.

As shown in FIG. 9B, the first and second sidewall insulators 4a and 4b are then formed on the side surfaces of the first and second gate electrodes 3a and 3b, respectively.

The seventh ion implantation is then performed to form the second source region 11b and the first drain region 12a (FIG. 9B). For example, n-type impurities such as arsenic (As) and phosphorus (P) are used in the seventh ion implantation. In the seventh ion implantation of the present embodiment, the ion implantation energy is set at 20 keV for arsenic and at 5 keV for phosphorus, and the dose is set at $2.0 \times 10^{15}$ cm$^{-2}$ for arsenic and at $2.0 \times 10^{15}$ cm$^{-2}$ for phosphorus.

The eighth ion implantation is then performed to form the first source region 11a, the second drain region 12b, the fifth diffusion region 17a, and the sixth diffusion region 17b (FIG. 9B). For example, p-type impurities such as boron (B) are used in the eighth ion implantation. In the eighth ion implantation of the present embodiment, the boron ion implantation energy is set at 2 keV, and the boron dose is set at $4.0 \times 10^{15}$ cm$^{-2}$.

RTA is then performed to activate the n- and p-type impurities implanted by the seventh and eighth ion implantations.

Subsequently, the silicide layers, the inter layer dielectrics, the plug layers, the interconnect layers, the passivation layer and the like are formed on the semiconductor substrate 1. For example, the first and second plug layers 31 and 33, the first and second interconnect layers 32 and 34, the first to third inter layer dielectrics 41 to 43 and the like of FIG. 2 are formed. In this way, the semiconductor device of the present embodiment is manufactured.

As described above, an n-type TFET of the second type is formed as the first transistor $Tr_1$, and a p-type TFET of the first type is formed as the second transistor $Tr_2$ in the present embodiment. Therefore, the present embodiment can provide a semiconductor device of a simple structure when a plurality of tunnel transistors ($Tr_1$ and $Tr_2$) are formed on the semiconductor substrate 1 to form a circuit.

(Third Embodiment)

Figure 10:
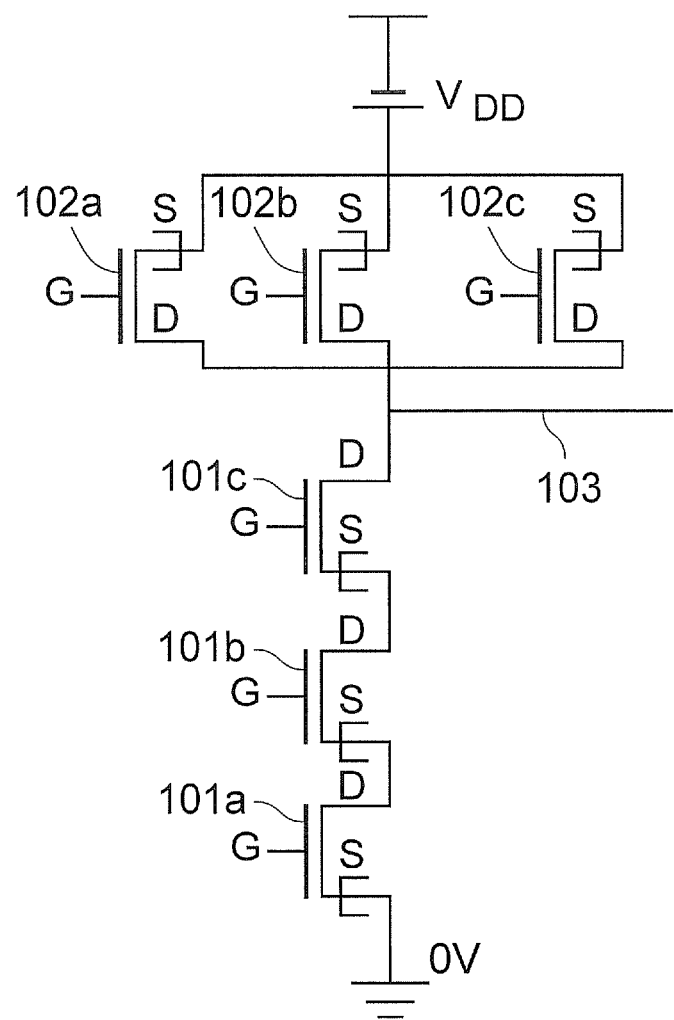
FIG. 10 is a circuit diagram showing a circuit configuration of a semiconductor device of a third embodiment.

FIG. 10 is a circuit diagram showing a circuit configuration of a semiconductor device of a third embodiment.

The semiconductor device of FIG. 10 includes the semiconductor substrate 1 (not shown), first transistors 101a to 101c formed on the semiconductor substrate 1, and second transistors 102a to 102c formed on the semiconductor substrate 1. The first and second transistors 101a to 102c form a NAND circuit.

Each of the first transistors 101a to 101c is an n-type TFET. The first transistors 101a to 101c are connected in series (cascode connection). The source S of the first transistor 101a is electrically connected to a ground voltage (=0 V), and the drain D of the first transistor 101a is electrically connected to the source S of the first transistor 101b. The drain D of the first transistor 101b is electrically connected to the source S of the first transistor 101c. The drain D of the first transistor 101c is electrically connected to the output part 103 of the NAND circuit.

Each of the second transistors 102a to 102c is a p-type TFET. The second transistors 102a to 102c are connected in parallel and electrically connected to the first transistors 101a to 101c. The sources S of the second transistors 102a to 102c are electrically connected to a power supply voltage (=$V_{DD}$). The drains D of the second transistors 102a to 102c are electrically connected to the drain D of the first transistor 101c and the output part 103 of the NAND circuit.

The first transistors 101a to 101c of the present embodiment have the same structure as the first transistor Tr₁ of FIG. 1. Therefore, each of the first transistors 101a to 101c of the present embodiment is the first type TFET in which the first source region 11a and the first channel region 15a have the same conductivity type. In each of the TFETs, when the power supply voltage is applied to the interconnect 22a and the fifth diffusion region 17a, the reverse bias voltage can be applied to the pn junction between the first channel region 15a and the first well region 16a.

On the other hand, the second transistors 102a to 102c of the present embodiment have the same structure as the second transistor Tr₂ of FIG. 1. Therefore, each of the second transistors 102a to 102c of the present embodiment is the second type TFET in which the second source region 11b and the second channel region 15b have opposite conductivity types. In each of these TFETs, when the power supply voltage is applied to the interconnect 22b and the sixth diffusion region 17b, the reverse bias voltage can be applied to the pn junction between the second channel region 15b and the second well region 16b.

Alternatively, the first transistors 101a to 101c of the present embodiment may have the same structure as the first transistor Tr₁ of FIG. 3, and the second transistors 102a to 102c of the present embodiment may have the same structure as the second transistor Tr₂ of FIG. 3. In other words, the first and second well regions 16a and 16b of these transistors may be replaced by the well region 16.

Similarly, the first transistors 101a to 101c of the present embodiment may have the same structure as the first transistor Tr₁ of FIG. 4, and the second transistors 102a to 102c of the present embodiment may have the same structure as the second transistor Tr₂ of FIG. 4. In other words, the fifth and sixth diffusion regions 17a and 17b of these transistors may be replaced by the diffusion region 17.

In the present embodiment, the sources S of the first transistors 101b and 101c are electrically floating. Therefore, if a forward bias voltage is applied to the pn junction between the first channel region 15a and the first well region 16a in these transistors, a leakage current can flow between these regions. However, according to the present embodiment, a reverse bias voltage can be applied to the pn junction so that the leakage current can be prevented from flowing between these regions. The reverse bias voltage can be applied by using the fifth diffusion region 17a and the interconnect 22a in these transistors.

The first transistors 101a to 101c of the present embodiment may have the same structure as the first transistor Tr₁ of FIG. 7, and the second transistors 102a to 102c of the present embodiment may have the same structure as the second transistor Tr₂ of FIG. 7. In this case, the first transistors 101a to 101c of the present embodiment are the second type TFETs, and the second transistors 102a to 102c of the present embodiment are the first type TFETs.

(Fourth Embodiment)

Figure 11:
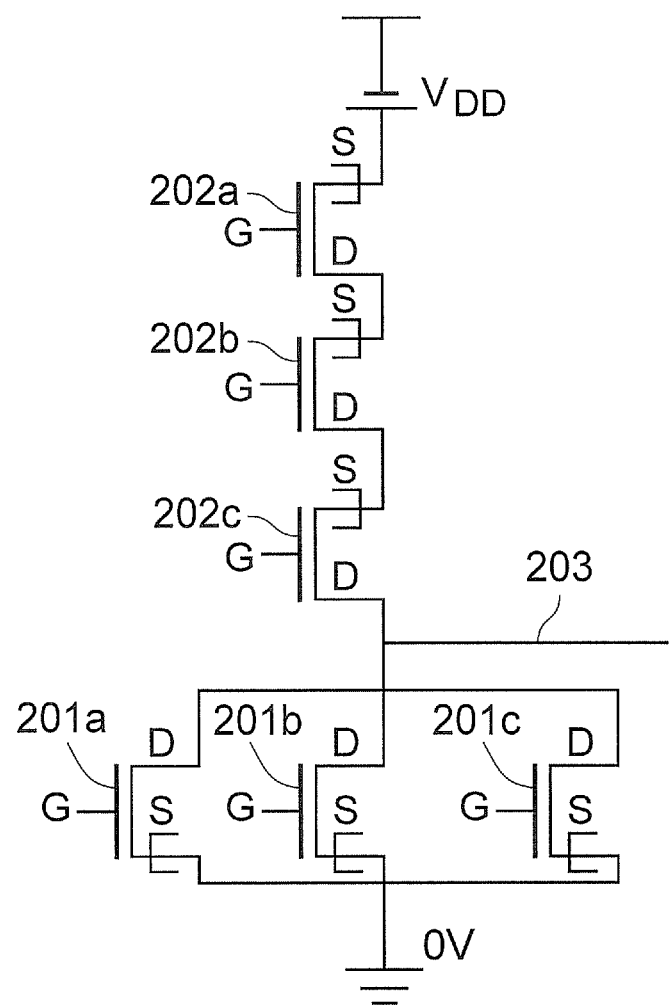
FIG. 11 is a circuit diagram showing a circuit configuration of a semiconductor device of a fourth embodiment.

FIG. 11 is a circuit diagram showing a circuit configuration of a semiconductor device of a fourth embodiment.

The semiconductor device of FIG. 11 includes the semiconductor substrate 1 (not shown), first transistors 201a to 201c formed on the semiconductor substrate 1, and second transistors 202a to 202c formed on the semiconductor substrate 1. The first and second transistors 201a to 202c form a NOR circuit.

Each of the first transistors 201a to 201c is an n-type TFET. The first transistors 201a to 201c are connected in parallel and electrically connected to the second transistors 202a to 202c. The sources S of the first transistors 201a to 201c are electrically connected to a ground voltage (=0 V). The drains D of the first transistors 201a to 201c are electrically connected to the drain D of the second transistor 202c and the output part 203 of the NOR circuit.

Each of the second transistors 202a to 202c is a p-type TFET. The second transistors 202a to 202c are connected in series (cascode connection). The source S of the second transistor 202a is electrically connected to a power supply voltage (=$V_{DD}$), and the drain D of the second transistor 202a is electrically connected to the source S of the second transistor 202b. The drain D of the second transistor 202b is electrically connected to the source S of the second transistor 202c. The drain D of the second transistor 202c is electrically connected to the output part 203 of the NOR circuit.

The first transistors 201a to 201c of the present embodiment have the same structure as the first transistor Tr₁ of FIG. 1, 3, or 4. Therefore, the first transistors 201a to 201c of the present embodiment are the first type TFETs.

On the other hand, the second transistors 202a to 202c of the present embodiment have the same structure as the second transistor Tr₂ of FIG. 1, 3, or 4. Therefore, the second transistors 202a to 202c of the present embodiment are the second type TFETs.

Alternatively, the first transistors 201a to 201c of the present embodiment may have the same structure as the first transistor Tr₁ of FIG. 7, and the second transistors 202a to 202c of the present embodiment may have the same structure as the second transistor Tr₂ of FIG. 7. In this case, the first transistors 201a to 201c of the present embodiment are the second type TFETs, and the second transistors 202a to 202c of the present embodiment are the first type TFETs.

In this case, the sources S of the second transistors 202b and 202c are electrically floating. Therefore, if a forward bias voltage is applied to the pn junction between the second channel region 15b and the second well region 16b in these transistors, a leakage current can flow between these regions. However, according to the present embodiment, a reverse bias voltage can be applied to the pn junction so that the leakage current can be prevented from flowing between these regions. The reverse bias voltage can be applied by using the sixth diffusion region 17b and the interconnect 22b in these transistors.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

The invention claimed is:

1. A semiconductor device comprising:
    a semiconductor substrate;
    a first transistor of a first conductivity type disposed on the semiconductor substrate; and
    a second transistor of a second conductivity type disposed on the semiconductor substrate;
    wherein the first transistor comprises:
        a first gate electrode disposed on the semiconductor substrate via a first gate insulator;
        a first source region of the second conductivity type and a first drain region of the first conductivity type disposed to sandwich the first gate electrode; and a first channel region of the first or second conductivity type disposed between the first source region and the first drain region;
wherein the second transistor comprises:
a second gate electrode disposed on the semiconductor substrate via a second gate insulator;
a second source region of the first conductivity type and a second drain region of the second conductivity type disposed to sandwich the second gate electrode; and
a second channel region disposed between the second source region and the second drain region and having the same conductivity type as the first channel region; and
wherein the semiconductor device further comprises:
a well region disposed under the first and second channel regions to be in contact with the first and second channel regions, and having an opposite conductivity type of the first and second channel regions; and
one or more interconnects configured to apply reverse bias voltages to pn junctions between the well region and the first and second channel regions, the interconnects being disposed above the semiconductor substrate.

2. A semiconductor device comprising:
a semiconductor substrate;
a first transistor of a first conductivity type disposed on the semiconductor substrate; and
a second transistor of a second conductivity type disposed on the semiconductor substrate;
wherein the first transistor comprises:
a first gate electrode disposed on the semiconductor substrate via a first gate insulator;
a first source region of the second conductivity type and a first drain region of the first conductivity type disposed to sandwich the first gate electrode; and
a first channel region of the first or second conductivity type disposed between the first source region and the first drain region;
wherein the second transistor comprises:
a second gate electrode disposed on the semiconductor substrate via a second gate insulator;
a second source region of the first conductivity type and a second drain region of the second conductivity type disposed to sandwich the second gate electrode; and
a second channel region disposed between the second source region and the second drain region and having the same conductivity type as the first channel region; and
wherein the semiconductor device further comprises:
a well region disposed under the first and second channel regions to be in contact with the first and second channel regions, and having an opposite conductivity type of the first and second channel regions; and
a diffusion region disposed to electrically connect an interconnect above the semiconductor substrate and the well region, and having the same conductivity type as the well region.

3. The device of claim 1, further comprising an isolation insulator disposed in contact with the first and second drain regions, or disposed in contact with the first and second source regions.

4. The device of claim 1, wherein the semiconductor substrate has an opposite conductivity type of the well region.

5. A semiconductor device comprising:
a semiconductor substrate;
a first transistor of a first conductivity type disposed on the semiconductor substrate; and
a second transistor of a second conductivity type disposed on the semiconductor substrate;
wherein the first transistor comprises:
a first gate electrode disposed on the semiconductor substrate via a first gate insulator;
a first source region of the second conductivity type and a first drain region of the first conductivity type disposed to sandwich the first gate electrode; and
a first channel region of the first or second conductivity type disposed between the first source region and the first drain region;
wherein the second transistor comprises:
a second gate electrode disposed on the semiconductor substrate via a second gate insulator;
a second source region of the first conductivity type and a second drain region of the second conductivity type disposed to sandwich the second gate electrode; and
a second channel region disposed between the second source region and the second drain region and having the same conductivity type as the first channel region; and
wherein the semiconductor device further comprises:
a first well region disposed under the first channel region to be in contact with the first channel region, and having an opposite conductivity type of the first channel region; and
a second well region disposed under the second channel region to be in contact with the second channel region, and having an opposite conductivity type of the second channel region.

6. The device of claim 5, further comprising:
a first interconnect configured to apply a reverse bias voltage to a pn junction between the first channel region and the first well region, the first interconnect being disposed above the semiconductor substrate; and
a second interconnect configured to apply a reverse bias voltage to a pn junction between the second channel region and the second well region, the second interconnect being disposed above the semiconductor substrate.

7. The device of claim 5, further comprising:
a first region disposed to electrically connect a first interconnect above the semiconductor substrate and the first well region, and having the same conductivity type as the first well region; and
a second region disposed to electrically connect a second interconnect above the semiconductor substrate and the second well region, and having the same conductivity type as the second well region.

8. The device of claim 5, wherein the semiconductor substrate has an opposite conductivity type of the first and second well regions.

9. The device of claim 5, further comprising:
a first source extension region of the second conductivity type disposed in contact with the first source region;
a second source extension region of the first conductivity type disposed in contact with the second source region; and
a pocket region of the second conductivity type disposed in contact with the second source region, and disposed on an upper side of the second source extension region.

10. The device of claim 9, further comprising a halo region of the first conductivity type disposed in contact with the first source region, and disposed on lower and lateral sides of the first source extension region.

11. The device of claim 5, further comprising:
a first source extension region of the second conductivity type disposed in contact with the first source region;

a second source extension region of the first conductivity type disposed in contact with the second source region; and a pocket region of the first conductivity type disposed in contact with the first source region, and disposed on an upper side of the first source extension region.

12. The device of claim 11, further comprising a halo region of the second conductivity type disposed in contact with the second source region, and disposed on lower and lateral sides of the second source extension region.

13. The device of claim 5, further comprising an interconnect disposed above the semiconductor substrate to electrically connect the first and second drain regions.

14. A semiconductor device comprising:
a semiconductor substrate;
first transistors of a first conductivity type disposed on the semiconductor substrate; and
second transistors of a second conductivity type disposed on the semiconductor substrate;
wherein the first transistors are connected in series and the second transistors are connected in parallel and electrically connected to the first transistors, or the second transistors are connected in series and the first transistors are connected in parallel and electrically connected to the second transistors;
wherein each of the first transistors comprises:
a first gate electrode disposed on the semiconductor substrate via a first gate insulator;
a first source region of the second conductivity type and a first drain region of the first conductivity type disposed to sandwich the first gate electrode; and
a first channel region of the first or second conductivity type disposed between the first source region and the first drain region; and wherein each of the second transistors comprises:
a second gate electrode disposed on the semiconductor substrate via a second gate insulator;
a second source region of the first conductivity type and a second drain region of the second conductivity type disposed to sandwich the second gate electrode; and
a second channel region disposed between the second source region and the second drain region and having the same conductivity type as the first channel region.

15. The device of claim 14, further comprising a well region disposed under the first and second channel regions to be in contact with the first and second channel regions, and having an opposite conductivity type of the first and second channel regions.

16. The device of claim 15, further comprising one or more interconnects configured to apply reverse bias voltages to pn junctions between the well region and the first and second channel regions, the interconnect being disposed above the semiconductor substrate.

17. The device of claim 15, further comprising a diffusion region disposed to electrically connect an interconnect above the semiconductor substrate and the well region, and having the same conductivity type as the well region.

18. The device of claim 14, further comprising:
a first well region disposed under the first channel region to be in contact with the first channel region, and having an opposite conductivity type of the first channel region; and
a second well region disposed under the second channel region to be in contact with the second channel region, and having an opposite conductivity type of the second channel region.

* * * * *